(12) United States Patent
Yoo et al.

(10) Patent No.: US 11,676,989 B2
(45) Date of Patent: Jun. 13, 2023

(54) DISPLAY DEVICE AND METHOD FOR MANUFACTURING THE SAME

(71) Applicant: SAMSUNG DISPLAY CO., LTD., Yongin-si (KR)

(72) Inventors: Byung Han Yoo, Suwon-si (KR); Hongsick Park, Suwon-si (KR); Kijune Lee, Yongin-si (KR); Seokhyun Lim, Hwaseong-si (KR); Hyunmin Cho, Hwaseong-si (KR); Dae-Young Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 158 days.

(21) Appl. No.: 17/366,976

(22) Filed: Jul. 2, 2021

(65) Prior Publication Data
US 2022/0149108 A1 May 12, 2022

(30) Foreign Application Priority Data
Nov. 6, 2020 (KR) .................... 10-2020-0148053

(51) Int. Cl.
| | |
|---|---|
| *H01L 27/146* | (2006.01) |
| *H01L 25/18* | (2023.01) |
| *H01L 25/00* | (2006.01) |
| *G06V 40/13* | (2022.01) |
| *H01L 27/32* | (2006.01) |
| *H01L 23/00* | (2006.01) |

(52) U.S. Cl.
CPC .... *H01L 27/14685* (2013.01); *G06V 40/1324* (2022.01); *H01L 25/18* (2013.01); *H01L 25/50* (2013.01); *H01L 27/14623* (2013.01); *H01L 24/32* (2013.01); *H01L 27/323* (2013.01); *H01L 27/3244* (2013.01); *H01L 2224/32145* (2013.01)

(58) Field of Classification Search
CPC ... H01L 27/14685; H01L 25/18; H01L 25/50; H01L 27/14623
See application file for complete search history.

(56) References Cited

U.S. PATENT DOCUMENTS

| | | | |
|---|---|---|---|
| 9,287,329 B1* | 3/2016 | Lee ..................... | H01L 27/124 |
| 10,437,974 B2 | 10/2019 | He et al. | |
| 10,705,272 B2 | 7/2020 | Smith et al. | |
| 2015/0102442 A1* | 4/2015 | Ootsuka .............. | H04N 25/704 257/432 |
| 2020/0026903 A1 | 1/2020 | Hai et al. | |
| 2021/0376015 A1* | 12/2021 | Lim .................... | H01L 27/3272 |

(Continued)

FOREIGN PATENT DOCUMENTS

KR   10-2018-0053422   5/2018

*Primary Examiner* — Thao P Le
(74) *Attorney, Agent, or Firm* — F. Chau & Associates, LLC

(57) ABSTRACT

Provided is a display device including a display layer which includes an active area and a peripheral area adjacent to the active area, a biometric information sensing layer disposed below the display layer and including a sensor, and an optical pattern layer disposed on an optical pattern plane between the biometric information sensing layer and the display layer and including a light blocking part and a transmission part having higher light transmittance than the light blocking part, wherein an upper surface of the light blocking part is concave, and recessed away from the optical pattern plane.

20 Claims, 10 Drawing Sheets

(56) References Cited

U.S. PATENT DOCUMENTS

| | | | |
|---|---|---|---|
| 2022/0067328 A1* | 3/2022 | Ryu | G06V 40/1329 |
| 2022/0123036 A1* | 4/2022 | Kim | G06V 40/1318 |
| 2022/0188536 A1* | 6/2022 | Bae | G06F 21/32 |
| 2022/0384398 A1* | 12/2022 | Yamazaki | H01L 27/3211 |
| 2022/0390657 A1* | 12/2022 | Nakata | G02B 1/118 |
| 2022/0406838 A1* | 12/2022 | Xue | G03F 7/0007 |

* cited by examiner

DISPLAY DEVICE AND METHOD FOR MANUFACTURING THE SAME

CROSS-REFERENCE TO RELATED APPLICATIONS

This U.S. non-provisional patent application claims priority under 35 U.S.C. § 119 of Korean Patent Application No. 10-2020-0148053, filed on Nov. 6, 2020, the entire contents of which are incorporated by reference herein.

TECHNICAL FIELD

The present disclosure herein relates to a display device having increased fingerprint recognition performance and a method for manufacturing the same.

DISCUSSION OF THE RELATED ART

Display devices may provide information to users by displaying images, or detecting user inputs. Current display may also facilitate user interaction by detecting fingerprints. Fingerprint recognition methods include a capacitance method that detects changes in capacitance formed between electrodes, an optical method that detects incident light using an optical sensor, and an ultrasonic method that detects vibration using a piezoelectric body. In the current display devices, input sensors for fingerprint recognition may be disposed on a rear surface of a display layer. In some cases, however, polishing processes used to fabricate fingerprint recognition layers may be imperfect, and lead to a decreased transmission of reflected light off of the user's fingerprint.

SUMMARY

The present disclosure provides a display device with increased fingerprint recognition performance and a method for manufacturing the same.

An embodiment of the inventive concept provides a display device including a display layer which includes an active area and a peripheral area adjacent to the active area, a biometric information sensing layer disposed below the display layer and including a sensor, and an optical pattern layer disposed on an optical pattern plane between the biometric information sensing layer and the display layer and including a light blocking part and a transmission part having higher light transmittance than the light blocking part, wherein an upper surface of the light blocking part is more concavely recessed away from the optical pattern plane than an edge of the transmission part adjacent to the light blocking part.

In an embodiment, the transmission part may have a greater minimum thickness than the light blocking part.

In an embodiment, an upper surface of the optical pattern layer may be uneven.

In an embodiment, an upper surface of the transmission part may be substantially flat, and the upper surface of the light blocking part may be curved.

In an embodiment, the light blocking part may include an organic material.

In an embodiment, the biometric information sensing layer may overlap the active area in a thickness direction.

In an embodiment, the transmission part and the light blocking part may overlap the sensor in the thickness direction.

In an embodiment, the optical pattern layer may be directly disposed on the biometric information sensing layer.

In an embodiment, the light blocking part may have a lesser thickness than the transmission part.

In an embodiment, an upper surface of the transmission part may include a flat first portion and a second portion protruding further than the first portion.

In an embodiment, in a plan view, the second portion may surround the first portion.

In an embodiment, the transmission part may include a transparent organic material.

In an embodiment of the inventive concept, a method for manufacturing a display device includes forming a biometric information sensing layer, forming an optical pattern layer on the biometric information sensing layer, and bonding a display layer onto the optical pattern layer, wherein the forming of the optical pattern layer includes forming a transmission layer on the biometric information sensing layer, forming a mask layer on the transmission layer, patterning the mask layer to form a mask pattern, patterning the transmission layer using the mask pattern to form a transmission part, forming a light blocking layer on the biometric information sensing layer and the transmission part, etching the light blocking layer to form a preliminary light blocking part, and removing the mask pattern to form a light blocking part.

In an embodiment, the forming of the preliminary light blocking part may include removing a portion of the light blocking layer disposed on the mask pattern.

In an embodiment, the forming of the preliminary light blocking part may include exposing the mask pattern.

In an embodiment, the forming of the light blocking part may include forming a protruding portion protruding in a thickness direction along an edge of the transmission part in the transmission part.

In an embodiment, the forming of the preliminary light blocking part may use a dry etching process, and the forming of the light blocking part may use a wet etching process.

In an embodiment, in the forming of the light blocking layer, an upper surface of the light blocking layer may be uneven.

In an embodiment, the forming of the light blocking part may be performed after the forming of the preliminary light blocking part.

In an embodiment, in the forming of the light blocking part, an upper surface of the transmission part may be flat, and an upper surface of the light blocking part may be curved.

BRIEF DESCRIPTION OF THE FIGURES

A more complete appreciation of the present disclosure and many of the attendant aspects thereof will be readily obtained as the same becomes better understood by reference to the following detailed description when considered in connection with the accompanying drawings, wherein.

DETAILED DESCRIPTION

Figure 1:
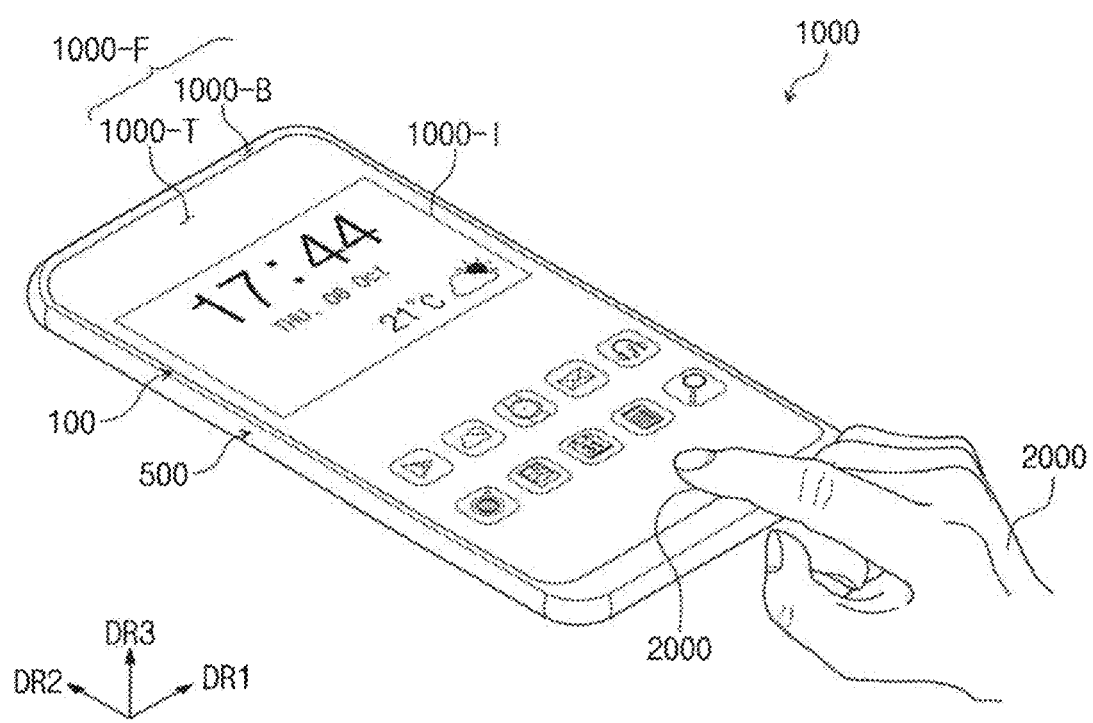
FIG. 1 is a perspective view of a display device according to an embodiment of the inventive concept.

In the present description, when an element (or a region, a layer, a portion, etc.) is referred to as being "on," "connected to," or "coupled to" another element, it means that the element may be directly disposed on/connected to/coupled to the other element, or that a third element may be disposed therebetween.

Like reference numerals may refer to like elements. Also, in the drawings, the thickness, the ratio, and the dimensions of elements may be exaggerated for an effective description of technical contents.

The term "and/or," includes all combinations of one or more of which associated configurations may define. The term "from the outside" may describe anything external to the embodiment currently being described. If a first element is described as "laterally surrounding" a second element, then the first element may surround the second element when viewed top down (ex., in a plan view).

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the inventive concept. Descriptions of elements in singular form may also apply to plural forms unless the context clearly indicates otherwise.

In addition, terms such as "below," "lower," "above," "upper," and the like are used to describe the relationship of the configurations shown in the drawings. The terms are used as a relative concept and are described with reference to the direction indicated in the drawings.

Unless otherwise defined, all terms (including technical and scientific terms) used herein have the same meaning as commonly understood by one of ordinary skill in the art to which the inventive concept pertains. It should also be understood that terms defined in commonly used dictionaries should be interpreted as having meanings consistent with their meanings in the context of the related art, and are expressly defined herein unless they are interpreted in an ideal or overly formal sense.

It should be understood that the terms "comprise", or "have" are intended to specify the presence of stated features, integers, steps, operations, elements, components, or combinations thereof in the disclosure, but do not necessarily preclude the presence or addition of one or more other features, integers, steps, operations, elements, components, or combinations thereof.

Hereinafter, embodiments of the inventive concept will be described with reference to the accompanying drawings.

Figure 2:
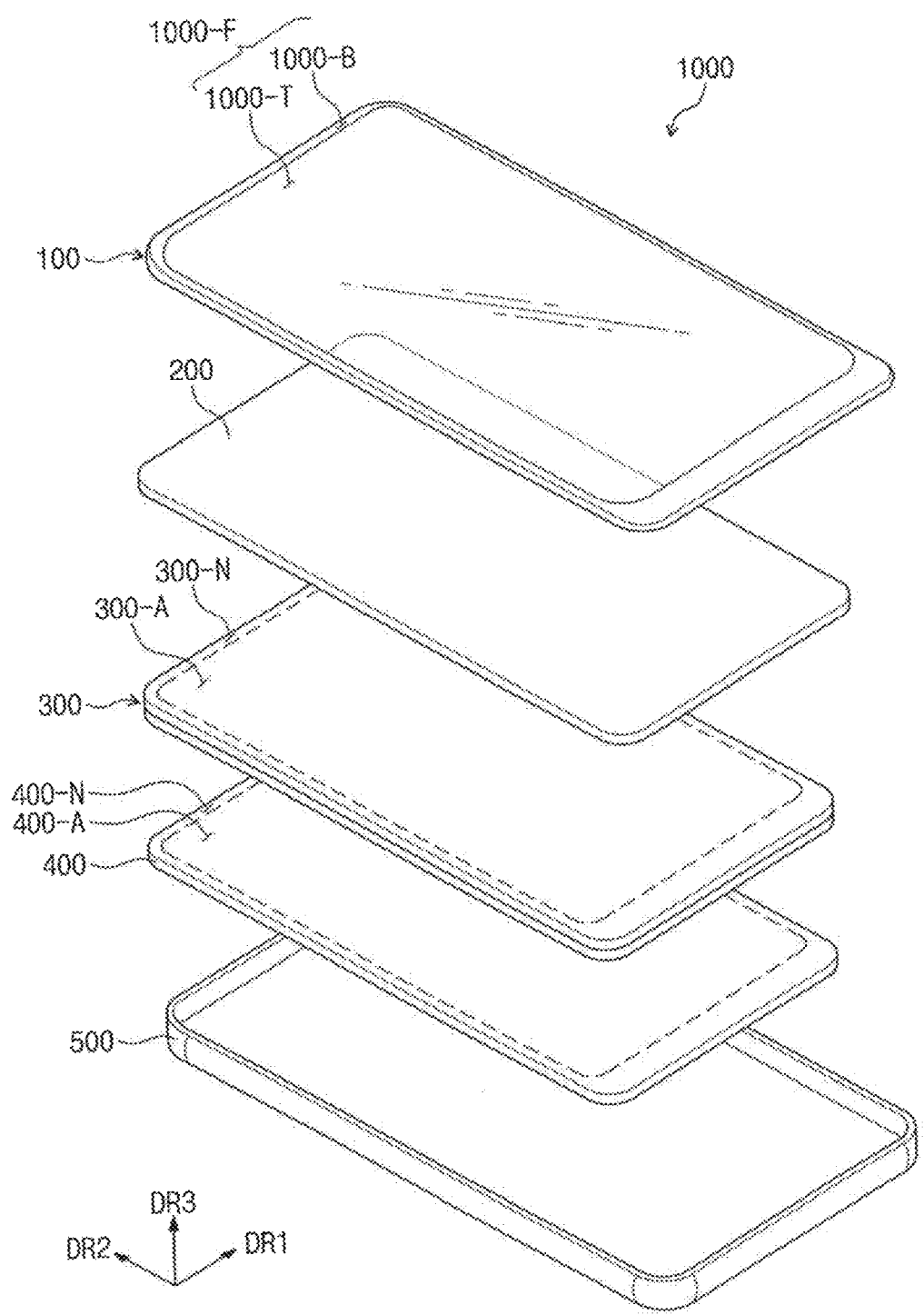
FIG. 2 is an exploded perspective view of a display device according to an embodiment of the inventive concept.

FIG. 1 is a perspective view of a display device according to an embodiment of the inventive concept. FIG. 2 is an exploded perspective view of a display device according to an embodiment of the inventive concept.

Referring to FIGS. 1 and 2, a display device 1000 may be activated responsive to electrical signals. The display device 1000 may include various embodiments. For example, the display device 1000 may be used for large-sized display devices such as a television set, a monitor, or an outdoor billboard. However, they display device 1000 may also be used for small- and medium-sized display devices such as a personal computer, a laptop computer, a personal digital terminal, a car navigation unit, a game console, a portable electronic device, and a camera. These are merely presented as examples, and the display device may be adopted for other electronic devices without departing from the inventive concept. In the present embodiment, a smartphone is illustrated as the display device 1000.

The display device 1000 may display an image 1000-I towards a third direction DR3 on a display surface 1000-F which is parallel to a first direction DR1 and a second direction DR2. The third direction DR3 may be referred to as a thickness direction DR3. The image 1000-I may include a still image as well as a dynamic image (for example, an interactive user interface, video, etc.). FIG. 1 illustrates watch windows and icons as an example of the image 1000-I. The display surface 1000-F on which the image 1000-I is displayed may correspond to a front surface of the display device 1000 and to a front surface of a window 100.

In the present embodiment, a front surface (or an upper surface) and a rear surface (or a lower surface) of respective members may be defined with respect to a direction in which the image 1000-I is displayed. Front and rear surfaces may oppose each other in the third direction DR3, and a normal direction of each of the front and rear surfaces may be parallel to the third direction DR3. In the present description, "when viewed on a plane" or "in a plan view" may be defined as viewed from the third direction DR3.

The display device 1000 according to an embodiment of the inventive concept may detect user inputs applied from the outside of the device. The user inputs may include various types of external inputs such as touch from a part of a user's body, light, heat, pen, or pressure. The display device 1000 is not necessarily limited to any one embodiment, and may detect the user inputs applied to a side or rear surface of the display device 1000 according to structures of the display device 1000.

The display device 1000 may detect a user's fingerprint 2000. A fingerprint recognition area may be provided on the display surface 1000-F of the display device 1000. The fingerprint recognition area may be provided in a whole portion of a transmission area 1000-T or it may be provided in a partial portion of the transmission area 1000-T.

The display device 1000 may include a window 100, an anti-reflection layer 200, a display module 300, a sensing unit 400, and a housing 500. In the present embodiment, the window 100 and the housing 500 may be bonded together to define an exterior of the display device 1000.

The window 100 may include an optically transparent, electrically insulating material. For example, the window 100 may include glass or plastic. The window 100 may have a multi-layer structure or a single-layer structure. For example, the window 100 may include a plurality of plastic films bonded through an adhesive, or a glass substrate and a plastic film bonded together through an adhesive.

As described above, the display surface 1000-F of the window 100 may define a front surface of the display device 1000. The transmission area 1000-T may be an optically transparent area. For example, the transmission area 1000-T may be an area having a visible light transmittance of about 90% or greater.

A bezel area 1000-B may be an area having relatively lower light transmittance than the transmission area 1000-T.

The bezel area 1000-B may define the shape of the transmission area 1000-T. The bezel area 1000-B may be adjacent to the transmission area 1000-T and laterally surround the transmission area 1000-T.

The bezel area 1000-B may have a predetermined color. The bezel area 1000-B may cover a peripheral area 300-N of the display module 300 to prevent the peripheral area 300-N from being viewed from the outside. However, this is an example embodiment, and the bezel area 1000-B of the window 100 may be omitted.

The anti-reflection layer 200 may be disposed below the window 100. The anti-reflection layer 200 may reduce reflectance of external light incident from an upper side of the window 100. In an embodiment of the inventive concept, the anti-reflection layer 200 may be omitted, and may be included in the display module 300.

The display module 300 may display the image 1000-I and detect external inputs. The display module 300 may include an active area 300-A and a peripheral area 300-N. The active area 300-A may be an area activated responsive to electrical signals. The peripheral area 300-N may be adjacent to the active area 300-A.

In the present embodiment, the active area 300-A may display the image 1000-I, and may detect external inputs as well. The transmission area 1000-T may overlap the active area 300-A. For example, the transmission area 1000-T may overlap a whole portion or at least a partial portion of the active area 300-A. Accordingly, users may view the image 1000-I through the transmission area 1000-T and provide external inputs. In an example embodiment of the inventive concept, an area displaying the image 1000-I and an area detecting external inputs may be separated from each other in the active area 300-A The peripheral area 300-N may be covered by the bezel area 1000-B. The peripheral area 300-N may be adjacent to the active area 300-A. The peripheral area 300-N may laterally surround the active area 300-A. A driving circuit or driving wiring for driving the active area 300-A may be disposed in the peripheral area 300-N.

The sensing unit 400 may be disposed below the display module 300. The sensing unit 400 may detect biometric information of users. The sensing unit 400 may detect a surface of a touch target. For example, the sensing unit may detect surface unevenness or curvature. For example, the surface may include users' fingerprint 2000 information.

The sensing unit 400 may include a sensing area 400-A and a non-sensing area 400-N. The sensing area 400-A may be activated responsive to electrical signals. For example, the sensing area 400-A may be an area where biometric information can be detected. A driving circuit or driving wiring for driving the sensing area 400-A may be disposed in the non-sensing area 400-N.

In an embodiment of the inventive concept, the sensing area 400-A may substantially overlap the active area 300-A. In this case, fingerprint recognition may be possible throughout the active area 300. For example, users' fingerprints may be recognizable in the whole area rather than a partial area or limited to a specific area. However, the embodiment of the inventive concept is not necessarily limited thereto. For example, in another embodiment of the inventive concept, the sensing unit 400 may overlap a portion of the active area 300-A.

The housing 500 may combine with the window 100. The housing 500 may combine with the window 100 to provide a predetermined interior space. The display module 300 and the sensing unit 400 may be disposed in the interior space. The housing 500 may stably protect components of the display device 1000 disposed in the interior space from external shocks. The housing 500 may include a material with a relatively high rigidity. For example, the housing 500 may include a plurality of frames and/or plates formed of glass, plastic, or metal, or a combination thereof.

A battery module supplying power required for the overall operation of the display device 1000 may be further disposed between the sensing unit 400 and the housing 500.

Figure 3:
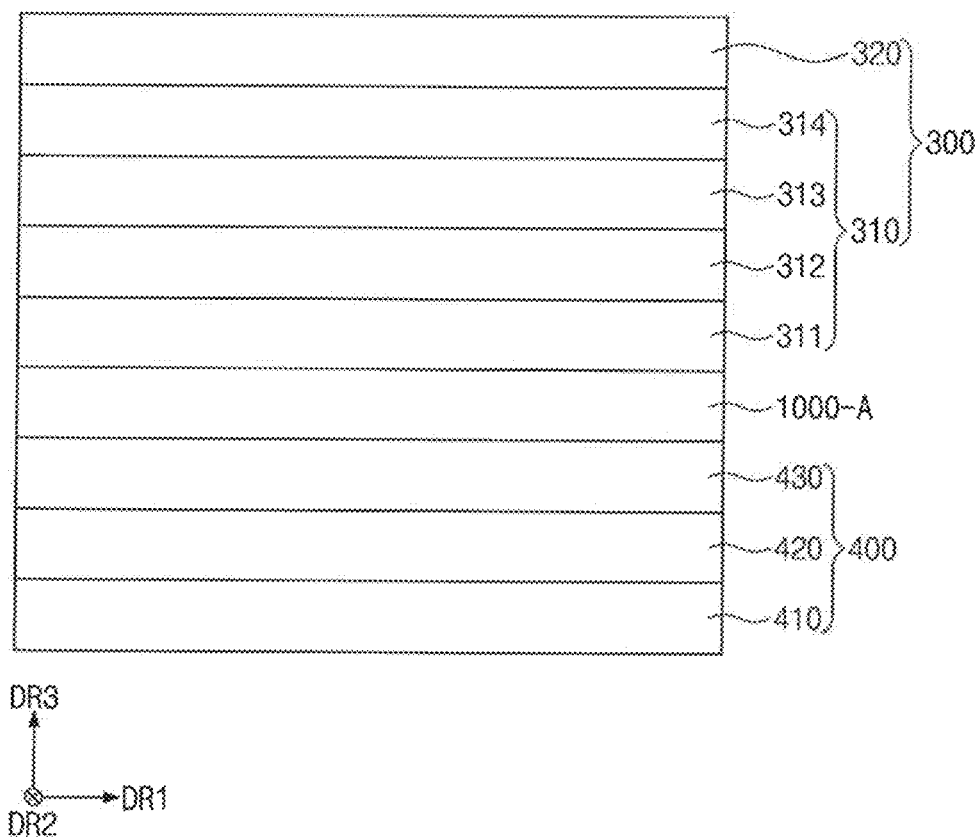
FIG. 3 is a schematic cross-sectional view of some components of a display device according to an embodiment of the inventive concept.

FIG. 3 is a schematic cross-sectional view of some components of a display device according to an embodiment of the inventive concept.

Referring to FIG. 3, the display module 300 may include a display layer 310 and a sensor layer 320.

The display layer 310 may be configured to display images. The active area 300-A (see FIG. 2) of the display module 300 may correspond to an active area of the display layer 310. For example, the sensing area 400-A (see FIG. 2) of the sensing unit 400 may overlap the whole active area of the display layer 310.

The display layer 310 according to an embodiment of the inventive concept may be a light emitting display layer However, the display layer 310 is not necessarily limited thereto. For example, the display layer 310 may be an organic light emitting display layer, a quantum dot light emitting display layer, a micro LED display layer, or a nano LED display layer. The display layer 310 may include a base layer 311, a circuit layer 312, a light emitting element layer 313, and an encapsulation layer 314.

The base layer 311 may include a synthetic resin film. The synthetic resin layer may include a thermosetting resin. In particular, the synthetic resin layer may be a polyimide-based resin layer, though the material is not necessarily limited thereto. The synthetic resin layer may include at least any one among an acrylic-based resin, a methacrylate-based resin, polyisoprene, a vinyl-based resin, an epoxy-based resin, a urethane-based resin, a cellulose-based resin, a siloxane-based resin, a polyamide-based resin, or a perylene-based resin. In addition, the base layer may include a glass substrate, a metal substrate, or an organic/inorganic composite material substrate.

The circuit layer 312 may be disposed on the base layer 311. The circuit layer 312 may include a pixel circuit and insulating layers. The pixel circuit may include at least one transistor and at least one capacitor.

The light emitting element layer 313 may be disposed on the circuit layer 312. The light emitting element layer 313 may generate light. The light emitting element layer 313 may generate light or control the amount of light responsive to electrical signals. When the display layer 310 is an organic light emitting display layer, the light emitting element layer 313 may include an organic light emitting material. When the display layer 310 is a quantum dot light emitting display layer, the light emitting element layer 313 may include quantum dots or quantum rods. When the display layer 310 is a micro LED display layer, the light emitting element layer 313 may include one or more micro LEDs. When the display layer 310 is a nano LED display layer, the light emitting element layer 313 may include one or more nano LEDs.

The encapsulation layer 314 may be disposed on the light emitting element layer 313. The encapsulation layer 314 may include at least one insulating layer. For example, the encapsulation layer 314 may include at least one inorganic film and at least one organic film. The inorganic layer of the encapsulation layer 314 may protect the light emitting element layer 313 from moisture and oxygen. The organic layer of the encapsulation layer 314 may protect the light emitting element layer 313 from foreign substances such as dust particles.

The sensor layer 320 may be disposed on the display layer 310. The sensor layer 320 may detect external inputs and obtain location information of the external inputs. The types of the external inputs may vary. For example, the external inputs may include touch from a part of a user's body, light, heat, or pressure. In addition, the sensor layer 320 may detect inputs in contact with the window 100 (see FIG. 2) as well as inputs close to or adjacent to the window 100.

The sensor layer 320 may be directly disposed on the display layer 310. For example, the sensor layer 320 and the display layer 310 may be formed in a continuous process. In an embodiment of the inventive concept, the sensor layer 320 may be bonded to the display layer 310. In this case, an adhesive layer may be further disposed between the sensor layer 320 and the display layer 310.

The sensing unit 400 may be disposed below the display module 300. For example, the sensing unit 400 may be bonded to a rear surface of the display layer 310. An adhesive layer 1000-A may be disposed between the sensing unit 400 and the display layer 310. For example, the adhesive layer 1000-A may be an optically clear adhesive member. The adhesive layer 1000-A may include a conventional adhesive and/or a gluing agent.

The sensing unit 400 may include a base layer 410, a biometric information sensing layer 420, and an optical pattern layer 430.

The base layer 410 may include a synthetic resin layer. The synthetic resin layer may include a thermosetting resin. In particular, the synthetic resin layer may be a polyimide-based resin layer, though the material is not necessarily limited thereto. For example, the base layer 410 may include two-layered polyimide-based resin layers and a barrier layer disposed between the polyimide-based resin layers. The barrier layer may include amorphous silicon and/or silicon oxide.

The biometric information sensing layer 420 may be disposed on the base layer 410. The biometric information sensing layer 420 may include a sensing circuit and insulating layers. The sensing circuit may include at least one transistor and at least one photodiode. In a plan view, the biometric information sensing layer 420 may overlap the whole active area of the display layer 310. For example, the biometric information sensing layer 420 may substantially overlap the active area of the display layer 310 in the vertical direction DR3.

The optical pattern layer 430 may be directly disposed on the biometric information sensing layer 420. For example, the optical pattern layer 430 and the biometric information sensing layer 420 may be formed in a continuous process. The optical pattern layer 430 may protect the biometric information sensing layer 420 from foreign substances.

The optical pattern layer 430 may filter light incident on the biometric information sensing layer 420. For example, light at incident angles capable of passing through the optical pattern layer 430 may be controlled through the optical pattern layer 430. The incident angles may be limited to less than a predetermined angle. By limiting the possible incident angles, the accuracy of fingerprint recognition may increase.

Figure 4:
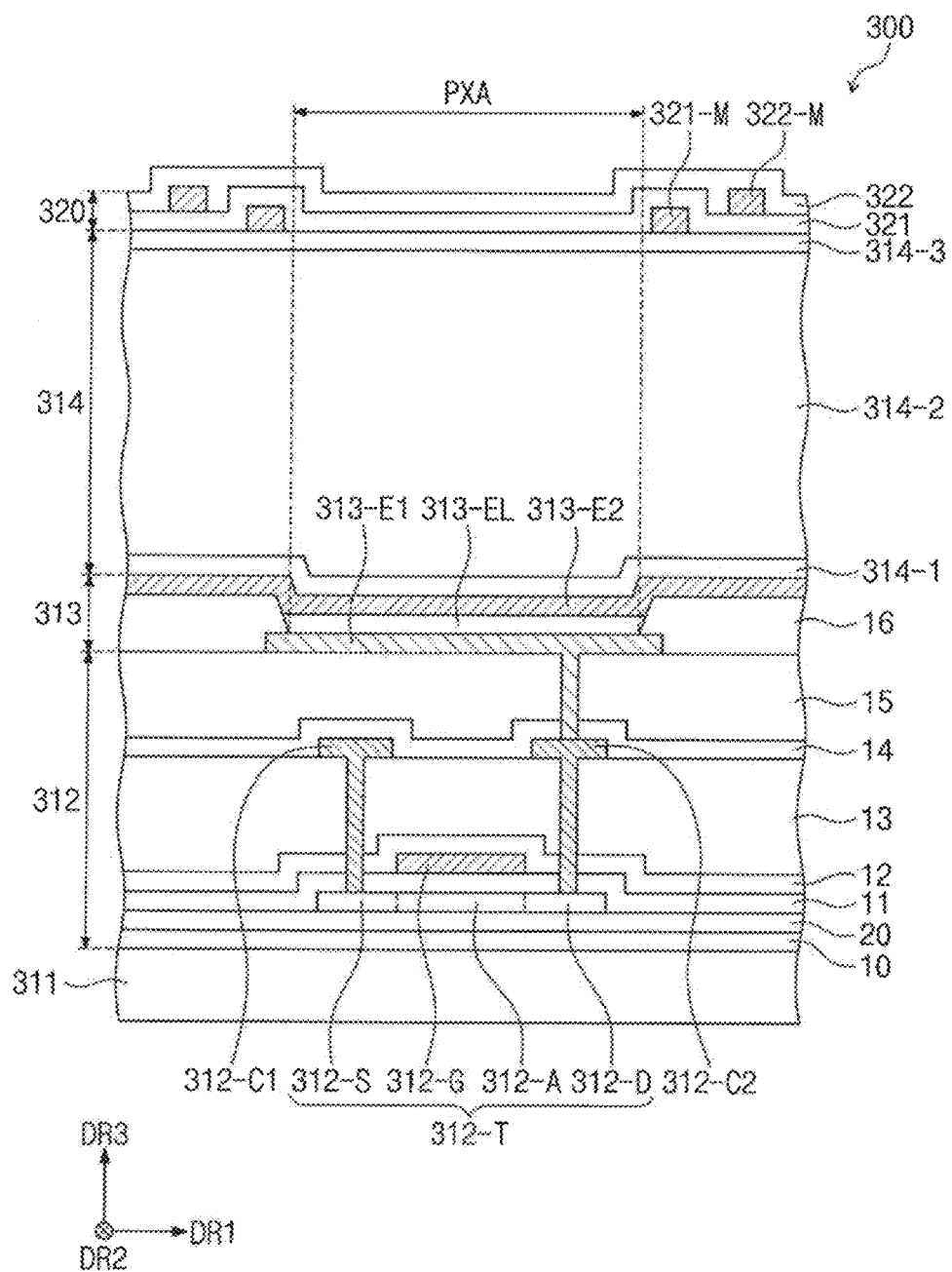
FIG. 4 is a cross-sectional view of a display module according to an embodiment of the inventive concept.

FIG. 4 is a cross-sectional view of a display module according to an embodiment of the inventive concept. In the description of FIG. 4, the same reference numerals are given for the components described through FIG. 3, and to the extent that a description of an element has been omitted, it may be assumed that the element is at least similar to corresponding elements that have been described elsewhere in the instant specification.

Referring to FIG. 4, a circuit layer 312, a light emitting element layer 313, an encapsulation layer 314, and a sensor layer 320 may be sequentially disposed on the base layer 311.

A barrier layer 10 may be disposed on the base layer 311. The barrier layer 10 prevents foreign substances from penetrating the display module. The barrier layer 10 may include at least one of a silicon oxide layer or a silicon nitride layer. Multiple of each layer may be provided in the barrier layer 10, and silicon oxide layers and silicon nitride layers may be alternately stacked.

A buffer layer 20 may be disposed on the barrier layer 10. The buffer layer 20 increases the bonding force between the base layer 311 and semiconductor patterns and/or conductive patterns. The buffer layer 20 may include at least one of a silicon oxide layer or a silicon nitride layer. The silicon oxide layer and the silicon nitride layer may be alternately stacked.

A transistor 312-T of the pixel circuit may be disposed on the buffer layer 20. The transistor 312-T may include an active 312-A, a source 312-S, a drain 312-D, and a gate 312-G.

Semiconductor patterns 312-S, 312-A, and 312-D are disposed on the buffer layer 20. Hereinafter, the semiconductor patterns 312-S, 312-A, and 312-D directly disposed on the buffer layer 20 may include a silicon semiconductor, a polysilicon semiconductor, or an amorphous silicon semiconductor. The semiconductor patterns 312-S, 312-A, and 312-D may have different electrical properties, and their electrical properties may depend on an amount of doping by impurities. The semiconductor pattern may include a first area having high conductivity and a second area having low conductivity. The first area may be doped with an N-type dopant or a P-type dopant. A P-type transistor may include a doped area doped with the P-type dopant, and a N-type transistor may include a doped area doped with the N-type dopant. The second area may be a non-doped area or may be doped in lower concentration than the first area.

The first area has greater conductivity than the second area, and accordingly the first area may serve as an electrode or a signal line. The second area may substantially correspond to an active (or a channel) of the transistor. For example, a portion of the semiconductor patterns 312-S, 312-A, and 312-D may be the active 312-A of the transistor 312-T, another portion may be the source 312-S or the drain 312-D of the transistor 312-T, and the other portion may be a connection signal line (or a connection electrode).

A first insulating layer 11 is disposed on the buffer layer 20 and may at least partially cover the semiconductor patterns 312-S, 312-A, and 312-D. The first insulating layer 11 may be an inorganic layer and/or an organic layer, and have a single-layer or multi-layer structure. The first insulating layer 11 may include at least one of aluminum oxide, titanium oxide, silicon oxide, silicon oxynitride, zirconium oxide, and hafnium oxide. In the present embodiment, the first insulating layer 11 may be a single-layered silicon oxide layer. The inorganic layer which will be described later may include at least one of the materials described above.

A gate 312-G may be disposed on the first insulating layer 11. The gate 312-G may be a portion of a metal pattern. In a plan view, the gate 312-G may overlap the active 312-A. In the process of doping the semiconductor pattern, the gate 312-G may function as a mask.

A second insulating layer 12 may be disposed on the first insulating layer 11 and may cover the gate 312-G. The second insulating layer 12 may be an inorganic layer, and may have a single-layer or multi-layer structure. In the present embodiment, the second insulating layer 12 may be a single-layered silicon oxide layer.

The third insulating layer 13 may be disposed on the second insulating layer 12. The third insulating layer 13 may be an organic layer, and have a single-layer or multi-layer structure. For example, the third insulating layer 13 may be a single-layered polyimide-based resin. However, the embodiment of the inventive concept is not necessarily limited thereto, and the third insulating layer 13 may include at least any one of: an acrylic-based resin, a methacrylate-based resin, polyisoprene, a vinyl-based resin, an epoxy-based resin, a urethane-based resin, a cellulose-based resin, a siloxane-based resin, a polyamide-based resin, and a perylene-based resin. The organic layer which will be described later may include at least one of the materials described above.

A first connection electrode 312-C1 and a second connection electrode 312-C2 may be disposed on the third insulating layer 13. The first connection electrode 312-C1 and the second connection electrode 312-C2 each may penetrate the first to third insulating layers 11, 12, and 13 to be electrically connected to the transistor 312-T.

A fourth insulating layer 14 may be disposed on the third insulating layer 13 and may substantially cover the first connection electrode 312-C1 and the second connection electrode 312-C2. The fourth insulating layer 14 may be an inorganic layer.

A fifth insulating layer 15 may be disposed on the fourth insulating layer 14. The fifth insulating layer 15 may be an organic layer, and have a single-layer or multi-layer structure.

The light emitting element layer 313 may be disposed on the fifth insulating layer 15. The light emitting element layer 313 may include a first electrode 313-E1, an emission layer 313-EL, and a second electrode 313-E2.

The first electrode 313-E1 may penetrate the fourth insulating layer 14 and the fifth insulating layer 15 to be electrically connected to the transistor 312-T. The first electrode 313-E1 may overlap Y or more transmission parts 431 (see FIG. 5). Y may be a positive integer, and descriptions of the transmission parts 431 (see FIG. 5) will be described later.

A pixel defining film 16 may be disposed on the fifth insulating layer 15. The pixel defining film 16 may have an opening that exposes the first electrode 313-E1. The shape of the opening on a plane may correspond to a pixel area PXA.

The emission layer 313-EL may be disposed on the first electrode 313-E1. The emission layer 313-EL may provide light of a predetermined color. In the present embodiment, the patterned single-layered emission layer 313-EL is illustrated as an example, but the embodiment of the inventive concept is not necessarily limited thereto. For example, the emission layer 313-EL may have a multilayer structure. In addition, the emission layer 313-EL may extend towards an upper surface of the pixel defining film 16.

The second electrode 313-E2 may be disposed on the emission layer 313-EL. An electronic control layer may be disposed between the second electrode 313-E2 and the emission layer 313-EL, and a hole control layer may be disposed between the first electrode 313-E1 and the emission layer 313-EL.

In an embodiment of the inventive concept, the first electrode 313-E1 and the second electrode 313-E2 each may include a transparent conductive material. For example, the first electrode 313-E1 and the second electrode 313-E2 each may include indium tin oxide (ITO), indium zinc oxide (IZO), indium gallium oxide (IGO), indium gallium zinc oxide (IGZO), and mixtures/compounds thereof. However, the materials in the first electrode 313-E1 and the second electrode 313-E2 are not necessarily limited thereto.

The encapsulation layer 314 may be disposed on the second electrode 313-E2. The encapsulation layer 314 may include a first inorganic layer 314-1, an organic layer 314-2, and a second inorganic layer 314-3.

The first inorganic layer 314-1 may be disposed on the second electrode 313-E2. The organic layer 314-2 may be disposed on the first inorganic layer 314-1. The second inorganic layer 314-3 may be disposed on the organic layer 314-2 and may cover the organic layer 314-2. The first inorganic layer 314-1 and the second inorganic layer 314-3 may include a silicon nitride layer, a silicon oxy nitride layer, a silicon oxide layer, a titanium oxide layer, an aluminum oxide layer, etc., and are not necessarily limited thereto. The organic layer 314-2 may include an acrylic-based organic layer, but is not necessarily limited thereto. The first inorganic layer 314-1 and the second inorganic layer 314-3 may protect first to third emission layers EC1, EL2, and EL3 from moisture/oxygen, and the organic layer 314-2 may protect the first to third emission layers EL1, EL2, and EL3 from foreign substances such as dust particles.

The sensor layer 320 may be disposed on the encapsulation layer 314. The sensor layer 320 may include a first conductive layer 321-M, a first sensing insulating layer 321, a second conductive layer 322-M, and a second sensing insulating layer 322. At least one of the first conductive layer 321-M or the second conductive layer 322-M may include sensing electrodes. The sensor layer 320 may obtain information of external inputs through changes in capacitance between the sensing electrodes.

Figure 5:
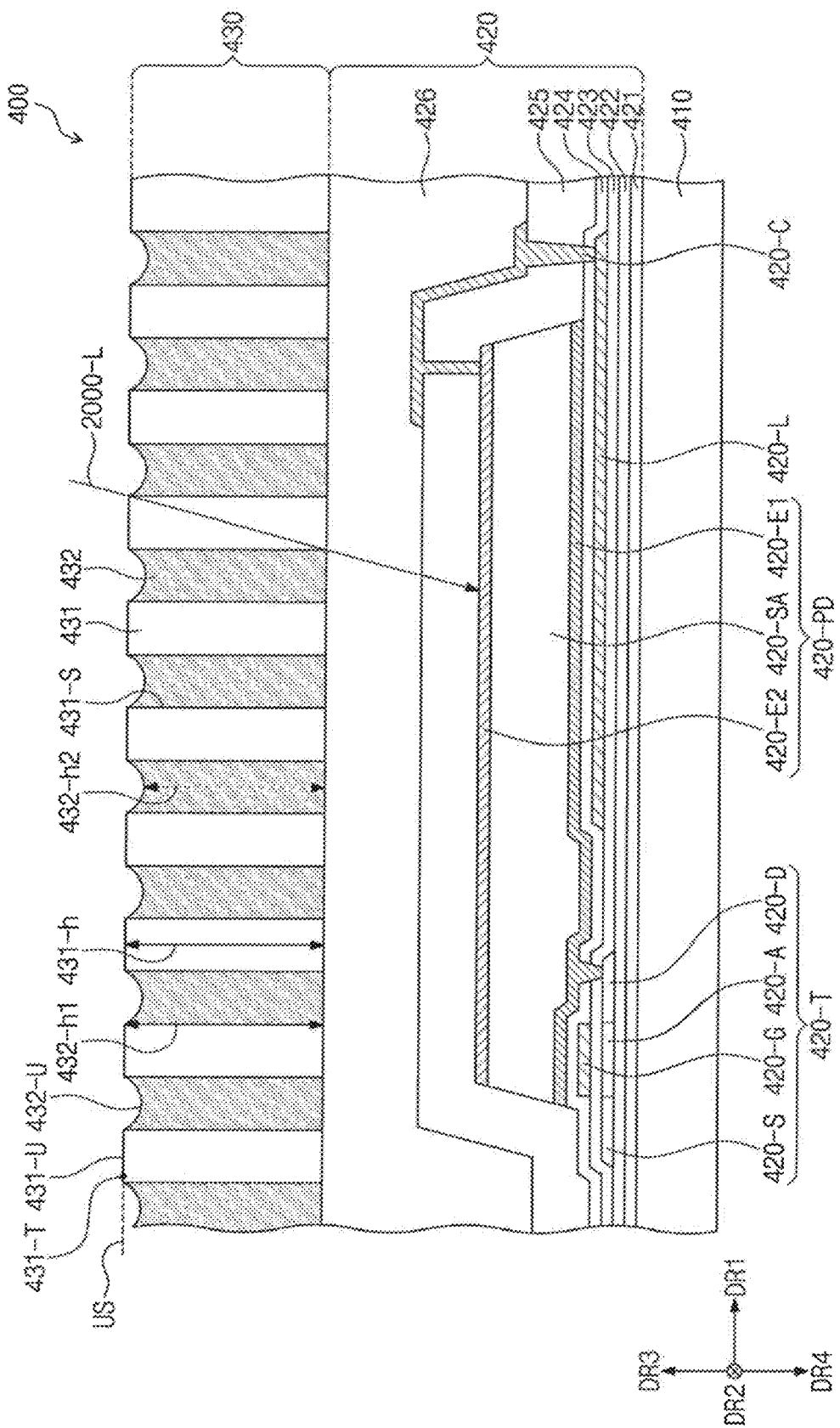
FIG. 5 is a cross-sectional view of a sensing unit according to an embodiment of the inventive concept.

FIG. 5 is a cross-sectional view of a sensing unit according to an embodiment of the inventive concept. In the description of FIG. 5, the same reference numerals are given for the components described through FIG. 3, and to the extent that a description of an element has been omitted, it may be assumed that the element is at least similar to corresponding elements that have been described elsewhere in the instant specification.

Referring to FIG. 5, the sensing unit 400 may include a base layer 410, a biometric information sensing layer 420, and an optical pattern layer 430. The sensing unit 400 according to an embodiment of the inventive concept may further include an IR filter. The IR filter may be disposed between the optical pattern layer 430 and the base layer 311 (see FIG. 4). However, the arrangement relationship of the IR filter according to an embodiment of the inventive concept is not necessarily limited thereto. For example, the IR filter may be disposed between the biometric information sensing layer 420 and the optical pattern layer 430. The IR filter may remove noise from the light 2000-L reflected from the fingerprint 2000 (see FIG. 1) to increase accuracy and response time of fingerprint recognition. The noise may be in an ultraviolet area of the light 2000-L.

A barrier layer 421 may be disposed on the base layer 410. A buffer layer 422 may be disposed on the barrier layer 421. Descriptions of the barrier layer 421 and the buffer layer 422 may be applicable to the barrier layer 10 and the buffer layer 20, respectively, as described above in FIG. 4.

A transistor 420-T may be disposed on the buffer layer 422. The transistor 420-T may include an active 420-A, a source 420-S, a drain 420-D, and a gate 420-G. The active 420-A, the source 420-S, and the drain 420-D may be disposed on the buffer layer 422.

A first insulating layer 423 is disposed on the buffer layer 422 and may at least partially cover the active 420-A, the source 420-S, and the drain 420-D. The first insulating layer 423 may be an inorganic layer and/or an organic layer, and have a single-layer or multi-layer structure. In the present embodiment, the first insulating layer 423 may be a single-layered silicon oxide layer.

The gate 420-G and a wiring layer 420-L may be disposed on the first insulating layer 423. A predetermined voltage such as a bias voltage may be provided to the wiring layer 420-L. The wiring layer 420-L may be electrically connected to a sensor 420-PD which will be described later.

A second insulating layer 424 may be disposed on the first insulating layer 423 and may cover the gate 420-G and the wiring layer 420-L. The second insulating layer 424 may be an inorganic layer, and may have a single-layer or multi-layer structure. In the present embodiment, the second insulating layer 424 may be a single-layered silicon oxide layer.

The sensor 420-PD may be disposed on the second insulating layer 424. The sensor 420-PD may be electrically connected to the transistor 420-T and the wiring layer 420-L. For example, the operation of the sensor 420-PD may be controlled through signals provided from the transistor 420-T, and the sensor 420-PD may be provided with a predetermined voltage from the wiring layer 420-L.

The sensor 420-PD may include a first sensing electrode 420-E1, a sensing layer 420-SA, and a second sensing electrode 420-E2.

The first sensing electrode 420-E1 may penetrate the first and second insulating layers 422 and 423 to be electrically connected to the transistor 420-T. The first sensing electrode 420-E1 may include an opaque conductive material. For example, the first sensing electrode 420-E1 may include molybdenum (Mo).

The sensing layer 420-SA may be disposed on the first sensing electrode 420-EL. The sensing layer 420-SA may include amorphous silicon.

The second sensing electrode 420-E2 may be disposed on the sensing layer 420-SA. The second sensing electrode 420-E2 may include a transparent conductive material. For example, the second sensing electrode 420-E2 may include indium tin oxide (ITO).

A third insulating layer 425 may be disposed on the second sensing electrode 420-E2. The third insulating layer 425 may be an inorganic layer, and may have a single-layer or multi-layer structure. For example, the third insulating layer 425 may include a silicon oxide layer and a silicon nitride layer.

A connection electrode 420-C may be disposed on the third insulating layer 425. The electrode 420-C may penetrate the third insulating layer 425 to be electrically connected to the second sensing electrode 420-E2. In addition, the connection electrode 420-C may penetrate the second and third insulating layers 424 and 425 to be electrically connected to the wiring layer 420-L.

A fourth insulating layer 426 may be disposed on the third insulating layer 425 and may cover the connection electrode 420-C. The fourth insulating layer 426 may be an organic layer, and may have a single-layer or multi-layer structure. For example, the fourth insulating layer 426 may be a single-layered polyimide-based resin.

The optical pattern layer 430 may be disposed between the biometric information sensing layer 420 and the display layer 310 (see FIG. 3). For example, the optical pattern layer 430 may be directly disposed on the fourth insulating layer 426. For example, the optical pattern layer 430 and the biometric information sensing layer 420 may be formed in a continuous process.

In one embodiment of the inventive concept, the optical pattern layer 430 is directly disposed on the biometric information sensing layer 420, and the distance between the optical pattern layer 430 and the second sensing electrode 420-E2 may thus be reduced. For example, the overall length of the optical path the light 2000-L travels from the optical pattern layer 430 to the second sensing electrode 420-E2 may be reduced. As a result, interference in the light passing through the optical pattern layer 430 may be prevented or reduced, and the accuracy of fingerprint recognition may increase.

The optical pattern layer 430 may include a plurality of transmission parts 431 (hereinafter, referred to as transmission parts) and a light blocking part 432. The transmission parts 431 may have optical transparency. The transmission parts 431 may have higher light transmittance than the light blocking part 432. The transmission parts 431 may include a transparent organic material. The light blocking part 432 may substantially absorb light. The light blocking part 432 may include an organic material.

In a plan view, the transmission parts 431 and the light blocking part 432 may overlap the sensor 420-PD. The light 2000-L reflected from the fingerprint 2000 (see FIG. t) may penetrate the transmission parts 431 to be incident on the sensor 420-PD.

An upper surface of the optical pattern layer 430 may be uneven. An upper surface 431-U of the transmission parts 431 surrounded by an edge 431-T and the edge 431-T may be flat. For example, the edge 431-T may be coplanar with an optical pattern plane US. An upper surface 432-U of the light blocking part 432 may have a curved surface. An upper surface 432-U of the light blocking part 432 may be more concavely recessed than the edge 431-T of the transmission part 431 adjacent to the light blocking part 432. The upper surface 432-U of the light blocking part 432 may be concavely recessed in a fourth direction DR4 from the optical pattern plane US including the upper surface 431-U of the transmission parts 431. The fourth direction DR4 may be a direction opposite to the third direction DR3. For example, when viewed in a cross section as in FIG. 5, the central portion of the upper surface 4320U of the light blocking part 432 may be lower than the edge portion. When viewed on a cross section, a side surface 431-S of each of the transmission parts 431 may overlap the light blocking part 432.

The light blocking part 432 may have a lesser thickness than the adjacent transmission part 431. For example, the first area of the light blocking part 432 which is adjacent to the transmission part 431 may have a first thickness 432-$h1$ greater than a second thickness 432-$h2$ of the second area of the light blocking part 432 which is spaced apart from the transmission part 431 in the first direction DR1. The transmission parts 431 each may have a minimum thickness 431-$h$ greater than a minimum thickness 432-$h2$ of the light blocking part 432.

According to an embodiment of the inventive concept, a portion of the light blocking part 432 overlapping the transmission parts 431 may be removed through a dry etching process, and a mask pattern HM (see FIG. 8B) disposed on the transmission parts 431 may be removed through a wet etching process. For example, materials overlapping each of the transmission parts 431 that reduce transmittance may be removed through the dry etching process and the wet etching process. Accordingly, the transmittance of each of the transmission parts 431 may be secured. In a plan view, the transmission parts 431 may not overlap the light blocking part 432. For example, the light 2000-L may pass unobstructed to the sensor 420-PD. Accordingly, the sensing unit 400 may have increased fingerprint recognition performance.

The dry etching process and the wet etching process will be described later.

Figure 6:
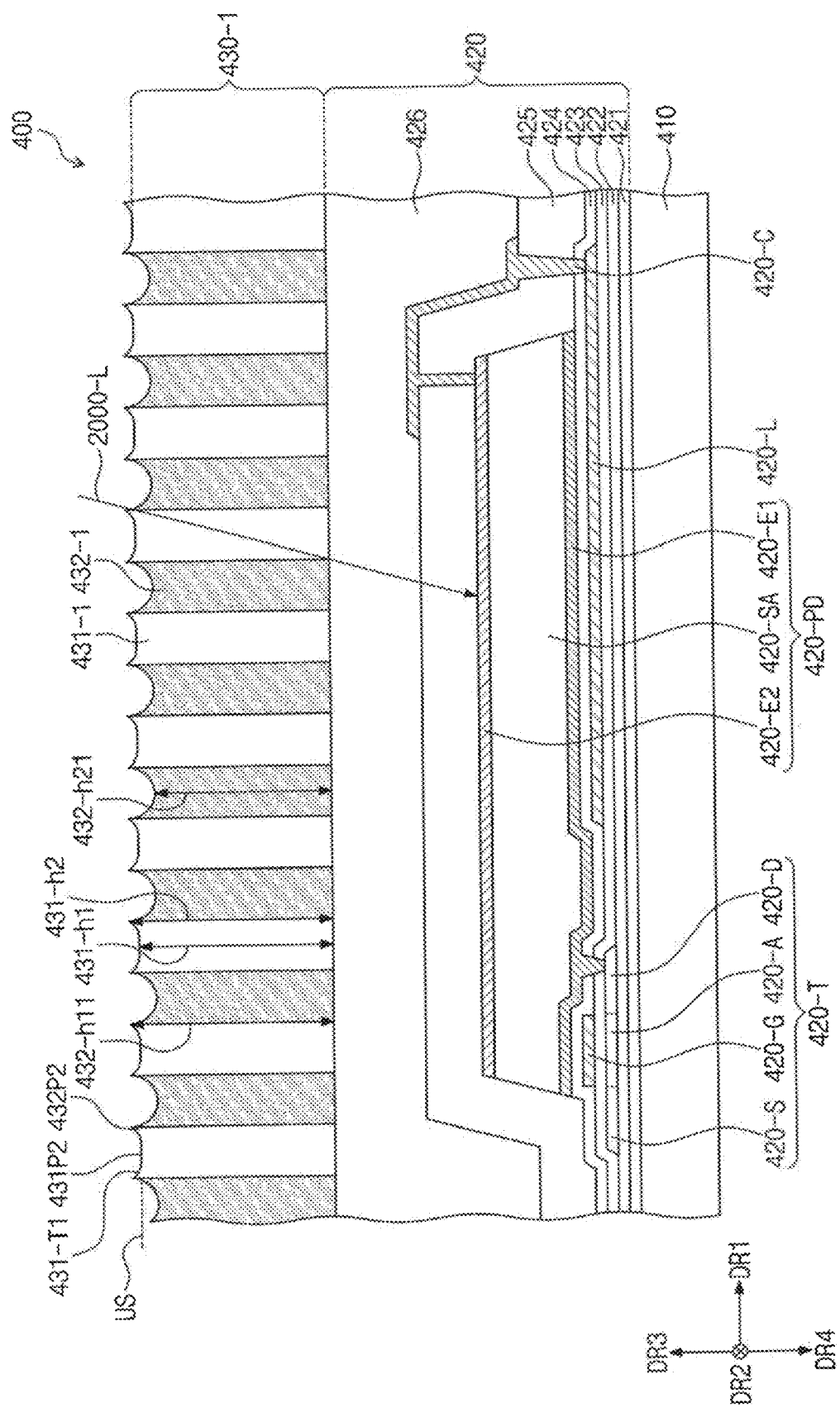
FIG. 6 is a cross-sectional view of a sensing unit according to an embodiment of the inventive concept.

FIG. 6 is a cross-sectional view of a sensing unit according to an embodiment of the inventive concept. In the description of FIG. 6, the same reference numerals are given for the components described through FIG. 5, and to the extent that a description of an element has been omitted, it may be assumed that the element is at least similar to corresponding elements that have been described elsewhere in the instant specification.

Referring to FIG. 6, an upper surface of an optical pattern layer 430-1 may have an uneven surface.

A transmission part 431-1 may include a first portion 431P2 and a second portion 432P2. The first portion 431P2 may have a flat upper surface. The second portion 432P2 may extend from the first portion 431P2. The second portion 432P2 may protrude from a plane US-1 including an upper surface of the first portion 431P2.

In a plan view, the second portion 432P2 may surround the first portion 431P2.

The thickness 431-$h1$ of the first portion 431P2 may be less than the thickness 431-$h2$ of the second portion 432P2.

The second portion 432P2 may be formed through swelling. The swelling may refer to a phenomenon in which the transmission parts 431-1, which are organic materials, swell by absorbing a solvent used in a wet etching process.

An upper surface of a light blocking part 432-1 may have a curved surface. The upper surface of the light blocking part 432-1 may be more concavely recessed than an edge 431-T1 of the transmission part 431-1 adjacent to the light blocking part 432-1. The upper surface of the light blocking part 432-1 may be concavely recessed in the fourth direction DR4 from the plane US-1 including the upper surface of the first portion 431 P2. For example, when viewed in a cross-section as in FIG. 6, a central portion of the upper surface of the light blocking part 432-1 may be lower than an edge portion of the upper surface of the light blocking pan 432-1.

The light blocking part 432-1 may have a lesser thickness from the adjacent transmission part 431-1. For example, the first area of the light blocking part 432-1 which is adjacent to the transmission part 431-1 may have a first thickness 432-$h11$ greater than a second thickness 432-$h21$ of the second area of the light blocking part 432-1 which is spaced apart from the transmission part 431-1 in the first direction DR1.

The transmission parts 431-1 each may have a minimum thickness 431-$h1$ greater than a minimum thickness 432-$h21$ of the light blocking part 432-1.

According to an embodiment of the inventive concept, the upper surface of the transmission parts 431-1 may be exposed through a dry etching process and a wet etching process. In a plan view, the transmission parts 431-1 may not overlap a light blocking part 432-2. The light 2000-L reflected from the fingerprint 2000 (see FIG. 1) and incident towards the transmission parts 431-1 may easily pass through the transmission parts 431-1. For example, the light 2000-L may pass unobstructed to the sensor 420-PD. Accordingly, the sensing unit 400 may have increased fingerprint recognition performance.

Figure 7:
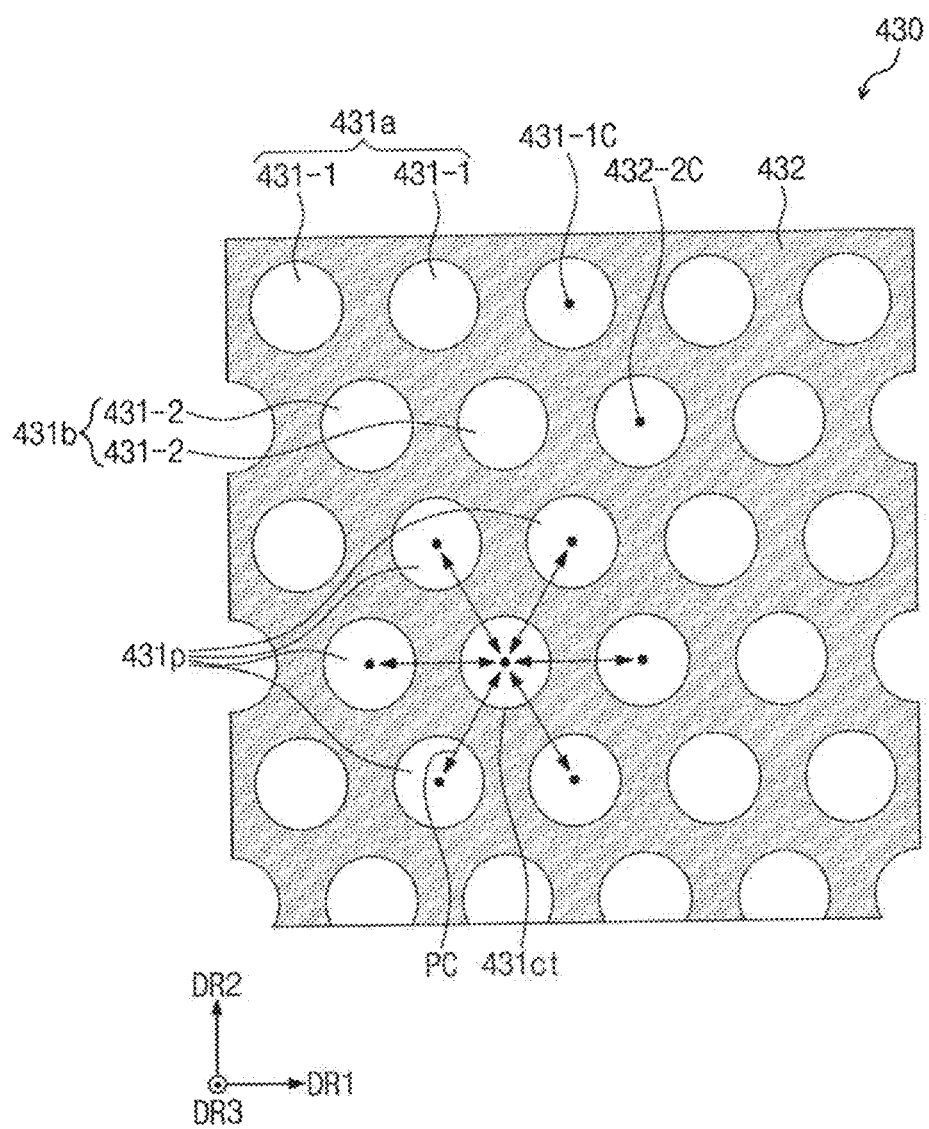
FIG. 7 is a plan view of an optical pattern layer according to an embodiment of the inventive concept.

FIG. 7 is a plan view of an optical pattern layer according to an embodiment of the inventive concept.

Referring to FIG. 7, the optical pattern layer 430 may include transmission parts 431-1 and 431-2 and a light blocking part 432.

In a plan view, the transmission parts 431 each may have a circular shape. The shape of the transmission parts 431 is not necessarily limited thereto, and the transmission parts 431 each may be formed into various shapes such as an oval and/or a polygon. For example, the transmission parts 431 each may have a hexagonal shape.

The transmission parts 431-1 and 431-2 may include first transmission parts 431-1 forming a first transmission arrangement 431$a$, and second transmission parts 431-2 forming a second transmission arrangement 431$b$. The first transmission parts 431-1 may be arranged along the first direction DR1, and the second transmission parts 431-2 may also be arranged along the first direction DR1.

The first transmission arrangement 431$a$ and the second transmission arrangement 431$b$ may be alternately arranged along the second direction DR2. A center 431-1$c$ of the first transmission parts 431-1 may not overlap a center 431-2$c$ of the second transmission parts 431-2 in the second direction DR2. For example, the first transmission parts 431-1 and the second transmission parts 431-2 may be arranged in zigzag pattern along the second direction DR2.

When one of the transmission parts 431-1 and 431-2 is defined as a central transmission part 431$ct$, six peripheral transmission parts 431$p$ spaced apart from the central transmission part 431$ct$ at the same pitch PC may be defined.

In a plan view, the transmission parts 431-1 and 431-2 may not overlap the light blocking part 432. The light blocking part 432 may surround the transmission parts 431-1 and 431-2.

FIGS. 8A to 8F are cross-sectional views illustrating forming an optical pattern layer according to an embodiment of the inventive concept.

Figure 8A:
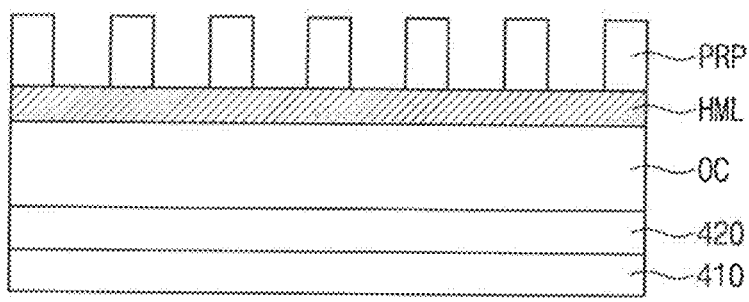
FIGS. 8A to 8F are cross-sectional views illustrating a process for forming an optical pattern layer according to an embodiment of the inventive concept.

Referring to FIG. 8A, the biometric information sensing layer 420 may be provided on the base layer 410. The biometric information sensing layer 420 may include light-receiving elements such as photodiodes and at least one insulating layer. A plurality of mask processes may be used to form the biometric information sensing layer 420.

A transmission layer OC may be formed on the biometric information sensing layer 420. The transmission layer OC may include a transparent organic material. The transmission layer OC may include a photosensitive material.

A mask layer HML may be formed on the transmission layer OC. The mask layer HML may be referred to as a hard mask layer.

After forming a photoresist layer including a photosensitive material on the transmission layer OC, the photoresist layer may be patterned to form a photoresist pattern PRP.

Figure 8B:
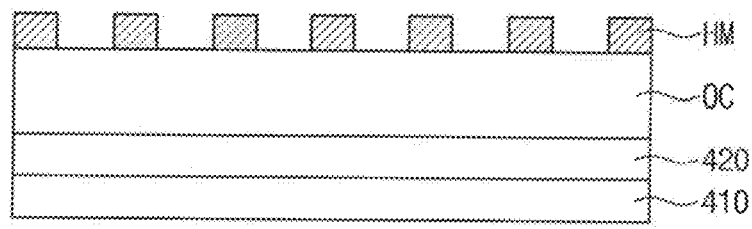

Referring to FIG. 8B, the mask layer HML (see FIG. 8A) may be patterned using the photoresist pattern PRP to form a mask pattern HM.

Figure 8C:
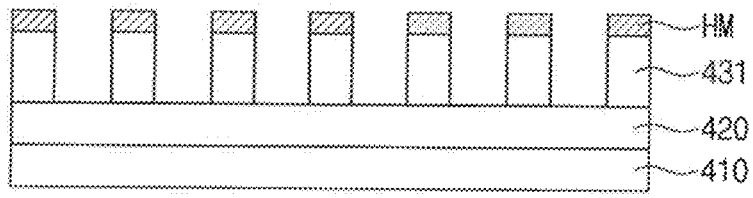

Referring to FIG. 8C, the transmission layer OC may be patterned using the mask pattern HM to form a plurality of transmission parts 431 (hereinafter, transmission parts). A dry etching process may be used to pattern the transmission parts 431.

Figure 8D:
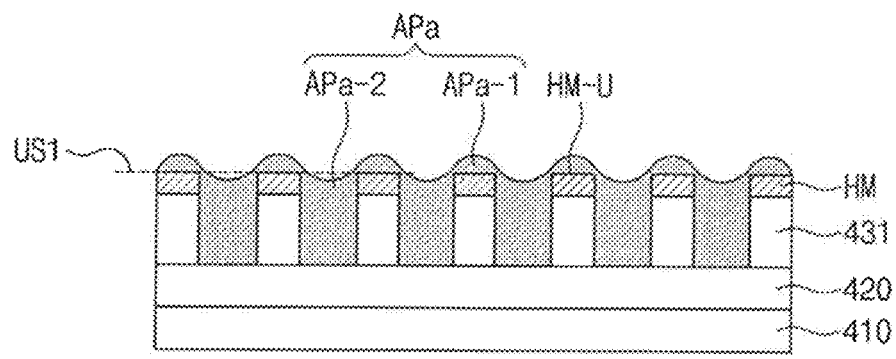

Referring to FIG. 8D, a light blocking layer APa may be formed on the transmission parts 431 and the biometric information sensing layer 420. The light blocking layer may include a first light blocking part APa-1 and a second light blocking part APa-2. The light blocking layer APa may be a colored organic material layer. The light blocking layer APa may include a material in which light absorbing particles are dispersed. For example, the light blocking layer APa may be a layer in which carbon-based pigments are mixed.

An upper surface of the light blocking layer APa may be uneven. For example, when viewed on a cross section, the upper surface of the light blocking layer APa may have a wavy shape.

The first light blocking part APa-1 of the light blocking layer APa may overlap the mask pattern HM. The first light blocking part APa-1 may be disposed above a plane US1 including an upper surface HM-U of the mask pattern HM.

The second light blocking part APa-2 may not overlap the mask pattern HM. The second light blocking part APa-2 may be disposed below the plane US1.

Figure 8E:
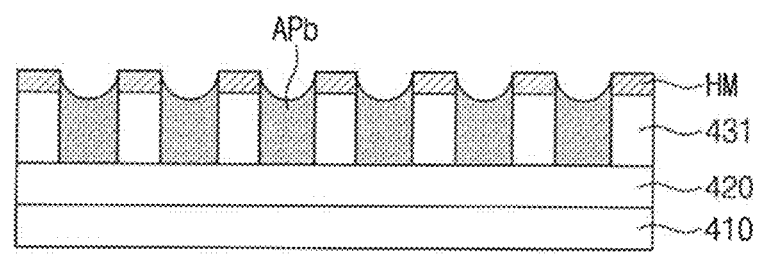

Referring to FIG. 8E, a preliminary light blocking pan APb may be formed by etching the light blocking layer APa (see FIG. 8D). For example, the preliminary light blocking part APb may be formed using a dry etching process.

The dry etching process may be a process of etching through an acceleration force and a chemical action of ions in a plasma state using mixed chemical gases or argon gases. The method of using the dry etching process may include sputter etching using sputtering, reactive ion etching (RIE), vapor phase etching, etc.

In the dry etching process, a portion of the light blocking layer APa (see FIG. 8D) including a cured organic material may be removed. The portion of the light blocking layer APa (see FIG. 8D) may be a light blocking layer APa (see FIG. 8D) disposed on the mask pattern HM. The mask pattern HM may be exposed to the outside through the dry etching process.

Figure 8F:
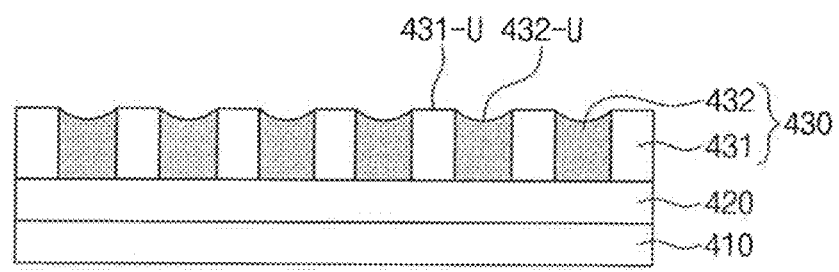

Referring to FIG. 8F, the mask pattern HM (see FIG. 8E) may be removed to form the light blocking part 432. For example, the light blocking part 432 may be formed using a wet etching process.

The wet etching process may be a process of etching using a chemical solution. The method of using the wet etching process may include a dipping method in which a substrate is immersed in a chemical solution for etching, a spray method in which a chemical solution is sprayed on a substrate for etching, and/or a spin method in which a substrate is fixed to a rotating table and soaked with a chemical solution.

The upper surface 431-U of each of the transmission parts 431 may be substantially flat. The upper surface 432-U of the light blocking part 432 may have a curvature.

The wet etching process may more easily remove the mask pattern HM (see FIG. 8E) than the preliminary light blocking part APa (see FIG. 8E) which is a cured organic layer.

According to an embodiment of the inventive concept, through the forming of the preliminary light blocking part APb and the light blocking part 432, the upper surface 431-U of each of the transmission parts 431 including a transparent organic material may be exposed to the outside. For example, in the forming of the preliminary light blocking part APb using a dry etching process, a portion of the light blocking layer APa overlapping the transmission parts 431 may be removed, and in the forming of the light blocking part 432 using a wet etching process, the mask pattern HM disposed on the transmission parts 431 may be removed. Accordingly, the transmittance of each of the transmission parts 431 may be secured. As a result, the light 2000-L (see FIG. 5) may pass unobstructed to the sensor 420-PD (see to FIG. 5). Accordingly, the sensing unit 400 (refer to FIG. 5) may have increased fingerprint recognition performance.

By utilizing the combination of dry etching and wet etching processes described herein, a display device according to the present inventive concept may be fabricated with unobstructed light transmission parts that lead to a recognition circuit. Accordingly, a display device according to the present inventive concept will have increased fingerprint recognition performance.

Unlike the embodiments of the inventive concept, when transmission parts and a light blocking part are formed through a chemical mechanical polishing process, an amount of polishing of the transmission parts and the light blocking part may not be controlled in the polishing process. For example, when the transparent units and the light blocking part are not sufficiently polished in the polishing process, a portion of the light blocking layer APa (see FIG. 8D) may remain on the upper surface of each of the transmission pans to prevent the light 2000-L (FIG. 5) reflected from the fingerprint 2000 (see FIG. 1) from passing through the transmission parts. In addition, polishing slurry provided in the polishing process may remain on the upper surface of each of the transmission parts even after the polishing is completed, thereby preventing the light 2000-L (see FIG. 5) reflected from the fingerprint 2000 (see FIG. 1) from passing through the transmission parts.

However, according to an embodiment of the inventive concept, the transmission layer OC (see FIG. 8B) is patterned using the mask pattern HM (see FIG. 8B) to form the transmission pans 431, and to form the light blocking layer APa (see FIG. 8D) above the biometric information sensing layer 420 and the transmission parts. The first portion APa-1 (see FIG. 8D) of the light blocking layer APa (see FIG. 8D) overlapping the transmission parts 431 may be removed using a dry etching process. The mask pattern 1-IM (see FIG. 8E) disposed on the transmission parts 431 may be removed using a wet etching process. For example, the materials overlapping the transmission parts 431 to reduce transmittance may be completely removed. The upper surface 431-U of each of the transmission parts 431 may be exposed. The transmittance of the transmission parts 431 may be secured. As a result, the light transmittance of the optical pattern layer 430 may be secured. Accordingly, the sensing unit 400 (see FIG. 5) may have increased fingerprint recognition performance.

Unlike the embodiments of the inventive concept, when transmission parts and a light blocking part are over-polished in the polishing using a chemical mechanical polishing process, the optical pattern layer 430 may have a largely uneven thickness such that not only the light reflected from a valley of the fingerprint 2000 (see FIG. 1) but also the light reflected from the other valley adjacent to the valley to passes through the transmission parts, and is provided to the sensor 420-PD. This may reduce the accuracy of fingerprint recognition. However, according to an embodiment of the inventive concept, the optical pattern layer 430 may be formed with a consistent thickness designed using a dry etching process and a wet etching process. The optical pattern layer 430 may control an incident angle of the light 2000-L based on the thickness. The incident angle may be limited to a predetermined angle or less. The optical pattern layer 430 may prevent light reflected from other valleys adjacent to the valley of the fingerprint 2000 (see FIG. 1) from reaching the sensor, which may cause inaccurate results. Accordingly, the accuracy or sensitivity of fingerprint recognition may increase.

Figure 9:
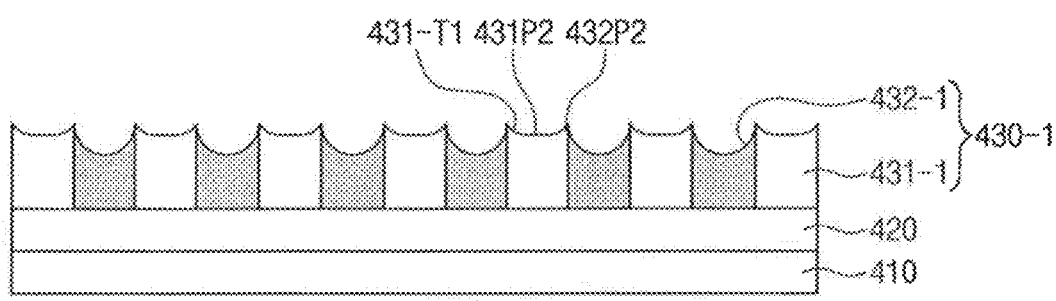
FIG. 9 is a cross-sectional view illustrating a process for forming an optical pattern layer according to an embodiment of the inventive concept.

FIG. 9 is a cross-sectional view illustrating forming an optical pattern layer according to an embodiment of the inventive concept. In the description of FIG. 9, the same reference numerals are given for the components described through FIG. 6, and FIGS. 8A to 8E, and to the extent that a description of an element has been omitted, it may be assumed that the element is at least similar to corresponding elements that have been described elsewhere in the instant specification.

Referring to FIG. 9, the transmission parts 431-1 each may swell by a solvent used in the wet etching process. In this case, a protruding portion which protrudes in the third direction DR3 may be formed along the edge of the transmission part 431-1. The protruding portion may be the second portion 432P2 (see FIG. 6).

According to an embodiment of the inventive concept, a display device may include a biometric information sensing layer and an optical pattern layer. The optical pattern layer may include a transmission part and a light blocking part. A portion of the light blocking part overlapping the transmission part may be removed through a dry etching process, and a mask pattern disposed on the transmission part may be removed through a wet etching process. For example, the materials overlapping the transmission part to reduce transmittance may be removed through the dry etching process and the wet etching process. Accordingly, the transmittance of the transmission part may be secured. For example, light may pass unobstructed to a sensor of the biometric information sensing layer. Therefore, a sensing unit may have increased fingerprint recognition performance.

Although the inventive concept has been described with reference to multiple embodiments of the inventive concept, it will be understood that the inventive concept should not be limited to these embodiments, and that various changes and modifications can be made by those skilled in the art without departing from the spirit and scope of the inventive concept. Accordingly, the technical scope of the inventive concept is not intended to be limited to the contents set forth in the detailed description of the specification, but is intended to be defined by the appended claims.

What is claimed is:

1. A display device comprising:
a display layer including an active area and a peripheral area, wherein the peripheral area is adjacent to the active area;
a biometric information sensing layer disposed below the display layer in a thickness direction and including a sensor; and
an optical pattern layer disposed on an optical pattern plane between the biometric information sensing layer and the display layer and including a light blocking part and a transmission part, wherein the transmission part has a higher transmittance of visible light than the light blocking part,
wherein an upper surface of the light blocking part is concave, and recessed in a direction away from the optical pattern plane.

2. The display device of claim 1, wherein the transmission part has a greater minimum thickness in the thickness direction than the light blocking part.

3. The display device of claim 1, wherein an upper surface of the optical pattern layer is uneven.

4. The display device of claim 1, wherein an upper surface of the transmission part is substantially flat.

5. The display device of claim 1, wherein the light blocking part comprises an organic material.

6. The display device of claim 1, wherein the biometric information sensing layer overlaps the active area in the thickness direction.

7. The display device of claim 1, wherein the transmission part and the light blocking part overlap the sensor in the thickness direction.

8. The display device of claim 1, wherein the optical pattern layer is directly disposed on the biometric information sensing layer.

9. The display device of claim 1, wherein the light blocking part has a lesser thickness in a center portion than the transmission part.

10. The display device of claim 1, wherein an upper surface of the transmission part comprises a flat first portion and a second portion protruding further than the first portion.

11. The display device of claim 10, wherein, in a plan view, the second portion surrounds the first portion.

12. The display device of claim 1, wherein the transmission part comprises a transparent organic material.

13. A method for manufacturing a display device, the method comprising:
forming a biometric information sensing layer;
forming an optical pattern layer on the biometric information sensing layer; and
bonding a display layer onto the optical pattern layer,
wherein the forming of the optical pattern layer includes:
forming a transmission layer on the biometric information sensing layer,
forming a mask layer on the transmission layer;
patterning the mask layer to form a mask pattern;
patterning the transmission layer using the mask pattern to form a transmission part;
forming a light blocking layer on the biometric information sensing layer and the transmission part;
etching the light blocking layer to form a preliminary light blocking part; and
removing the mask pattern to form a light blocking part.

14. The method of claim 13, wherein the forming of the preliminary light blocking part comprises removing a portion of the light blocking layer disposed on the mask pattern.

15. The method of claim 13, wherein the forming of the preliminary light blocking part comprises exposing the mask pattern.

16. The method of claim 13, wherein the forming of the light blocking part comprises forming a protruding portion which protrudes in a thickness direction along an edge of the transmission part in the transmission part.

17. The method of claim 13, wherein:
the forming of the preliminary light blocking part uses a dry etching process; and
the forming of the light blocking part uses a wet etching process.

18. The method of claim 13, wherein in the forming of the light blocking layer, an upper surface of the light blocking layer is uneven.

19. The method of claim 13, wherein the forming of the light blocking part comes after the forming of the preliminary light blocking part.

20. The method of claim 14, wherein, in the forming of the light blocking part, an upper surface of the transmission part is flat, and an upper surface of the light blocking part is curved.

* * * * *